United States Patent [19]

Wolski et al.

[11] Patent Number: 5,447,619
[45] Date of Patent: Sep. 5, 1995

[54] COPPER FOIL FOR THE MANUFACTURE OF PRINTED CIRCUIT BOARDS AND METHOD OF PRODUCING THE SAME

[75] Inventors: Adam M. Wolski, Edgewater Park, N.J.; Paul Dufresne, Langhorne, Pa.; Kurt Ac, Hamilton; Michel Mathieu, Robbinsville, both of N.J.

[73] Assignee: Circuit Foil USA, Inc., Bordentown, N.J.

[21] Appl. No.: 156,824

[22] Filed: Nov. 24, 1993

[51] Int. Cl.6 .................... C25D 1/04; C25D 7/06; B21C 37/00
[52] U.S. Cl. ........................ 205/50; 205/77; 205/155; 205/156; 205/197; 205/243; 205/244; 205/318; 205/319; 427/96; 428/607; 428/612; 428/658; 428/674; 428/687
[58] Field of Search .................. 205/67, 76, 77, 197, 205/243, 244, 152, 155, 156, 319; 428/607, 658, 687, 674, 612; 427/96

[56] References Cited

U.S. PATENT DOCUMENTS

| | | | |
|---|---|---|---|
| Re. 30,180 | 12/1979 | Wolski et al. | 428/601 |
| 2,769,774 | 11/1956 | Loveland et al. | 205/418 |
| 3,625,844 | 6/1969 | McKean | 240/140 |
| 3,674,656 | 7/1972 | Yates | 204/13 |
| 3,853,716 | 12/1974 | Yates et al. | 204/28 |
| 3,857,681 | 12/1974 | Yates et al. | 205/155 |
| 3,998,601 | 12/1976 | Yates et al. | 29/195 |
| 4,572,768 | 2/1986 | Wolski et al. | 204/15 |
| 5,207,889 | 5/1993 | Wolski et al. | 205/155 |
| 5,215,646 | 6/1993 | Wolski et al. | 205/77 |

FOREIGN PATENT DOCUMENTS 152490 9/1982 Japan .

OTHER PUBLICATIONS

Grant and Hackh's Chemical Dictionary, 5th ed. (1987), p. 135.

Primary Examiner—John Niebling
Assistant Examiner—Edna Wong
Attorney, Agent, or Firm—Finnegan, Henderson, Farabow, Garrett & Dunner

[57] ABSTRACT

A surface of copper foil is protected from oxidation and tarnishing by electrodepositing on the surface a protective layer containing metallic zinc and one or more compound of tri-valent chromium, which protection layer is easily removable by dissolution in a dilute aqueous alkaline solution and which preferably has a zinc to chromium weight ratio of 1:1 or greater. An electrodeposited copper foil especially suited for multilayer printed circuit boards has such a protective layer electrodeposited on the matte side thereof and an electrodeposited copper bonding treatment on the shiny side thereof.

9 Claims, 1 Drawing Sheet

COPPER FOIL FOR THE MANUFACTURE OF PRINTED CIRCUIT BOARDS AND METHOD OF PRODUCING THE SAME

FIELD OF THE INVENTION

This invention relates to a method of protecting the surface of copper foil against tarnishing and oxidation, and to electrodeposited copper foil suitable for use in the manufacture of printed circuit boards, especially multilayer printed circuit boards.

BACKGROUND OF THE INVENTION

The production of copper foil for electronic applications, e.g., copper-clad laminate for printed circuit boards, involves the use of a well-known electrodeposition process. This process utilizes a large cylindrical drum cathode which rotates, partially immersed in a copper sulfate-sulfuric acid electrolyte. The drum cathode is adjacent to and facing toward a pair of curved anodes, which may be formed of lead, lead-antimony, platinized titanium, iridium or ruthenium oxides. Both the drum and the anodes are connected electrically by heavy buss-bars to a D.C. power source and currents of up to 50,000 amps or more are commonly used. As the drum rotates in the electrolyte, an electrodeposit of copper forms on the drum surface, and as the latter leaves the electrolyte, the electrodeposited copper is continuously stripped from the rotating drum in the form of this foil, which is slit to size and wrapped around a take-up roll. The top surface of the drum is usually formed of stainless steel, titanium or chromium.

Foil produced in such a process, prior to being treated, is usually referred to as raw foil. The raw foil is pale pink in color and has two distinctly different looking sides - a "shiny side", the side which was plated onto the drum surface and then stripped is quite smooth while the other side, the side which was facing toward the electrolyte and the anodes, is referred to as the "matte" side since it has a velvety finish. The matte side can be imagined as a set of closely packed cones having heights of from five to ten microns, the cone heights depending upon the independent variables of foil thickness, current density, solution composition, and the like. This provides the basic shape of the foil surface for embedding in the resin of a substrate to promote adhesion in the copper clad laminates used in the manufacture of printed circuit boards (PCB's).

While the matte side of the foil has a certain micro-roughness, a surface bonding treatment is typically applied to the matte side of the raw foil to ensure adequate bonding strength after the copper-clad laminate is formed. The term "bonding treatment" is universally used to refer to changing one or both surfaces of the electroformed foil to make it suitable for bonding to laminate resins.

The bonding treatment operation is conducted in machines called "treaters" wherein rolls of raw foil are unrolled in a continuous manner and fed into the treater by means of driven rollers (similar to the way in which a web of paper is handled in a printing machine), rendered cathodic by means of contact rollers and passes in a serpentine fashion through one or more plating tanks, facing, in each tank, a rectangular anode. Each tank has its own supply of appropriate electrolyte and its D.C. power source. Between the tanks the foil is thoroughly rinsed on both sides. The purpose of this operation is to electrodeposit on at least one side of the foil, usually the matte side, microprojections of complex shape which ensure that the foil will be firmly anchored to the base polymeric materials used in fabricating the copper clad laminates.

High peel strength (the force necessary to pull apart the copper foil and the supporting insulating substrate material) is a characteristic of the highest importance, since the mechanical support of the circuit elements as well as the current carrying capability of PCB's is provided by the copper foil—polymer joint. It is essential that the foil is bonded very tightly and securely to the substrate and also that such an adhesive joint can withstand all the manufacturing steps in PCB's fabrication without the decrease of the initial adhesion, which, moreover should remain constant throughout the service life of the PCB.

This bonding operation is carried in laminating plants and involves heating and cooling cycles. Sheets of copper foil are laid upon sheets of "prepreg" (e.g., glass fabric impregnated with epoxy resin). Both materials are placed in a hydraulic press having heated pressing plates, and the two materials are pressed together under high pressure. At elevated temperatures the resin liquefies and is forced, by the pressure, to flow into the micro-irregularities of the foil surface. This is followed with a second cycle, when both materials are cooled, while the pressure is being maintained, the resin solidifies in the irregularities of the foil surface, and both materials are firmly bonded together and very difficult to pull apart. It is the responsibility of the matte side of the foil to ensure high peel strength.

The matte side of the finished foil, i.e., the base foil plus treatment, refers to the combined effect of the micro-topography of the matte surface of the base foil (electrodeposited at the drum machine) and the bonding treatment plated upon that surface at the treater machine. Both are equally important.

Until only a few years ago the main segment of the total output of PCB's manufactured in the United States was represented by single-sided and particularly double-sided boards. Classical copper foil is an ideal material for the manufacture of such boards.

As shown in FIG. 1, metallographic cross-sectioning of copper base foil 10 reveals that the foil's two opposing surfaces are not the same. While the surface formed next to the drum 12, the shiny side of the foil, even when viewed under great magnification, is relatively flat and smooth, the surface formed next to the electrolyte 14, the matte side of the foil, has micro-peaks and valleys. As shown in FIG. 2, the matte side, after application of the bonding treatment, comprise an extremely dense and uniform coating of spherical microprojections 16 which greatly enhance the surface area available for bonding to the polymeric substrates.

The shiny side of the foil, after the lamination, represents the processing side of the copper clad laminate. As such, it serves as a substrate for image patterning and soldering to ensure the necessary electrical connections between components. In the fabrication of multilayer PCB's (MLB's), the shiny side of the foil also serves as a surface to be treated by chemical means (brown-oxide or black oxide treatment) for bonding purposes.

Although many properties of the copper foil are important in the fabrication of rigid single or double-sided PCB's the peel strength is one of the most important among them. It has to be remembered that copper cladding represents the external surface of the laminate, and that thin copper foil lines can be relatively easily lifted off the surface of the insulating base material if the peel strength is not excellent.

This is why copper foil manufacturers take advantage of the "natural" micro-roughness of the matte surface of the base foil, which at that stage already has a potential "bondability" to polymers, and further enhance it with bonding treatment to achieve the highest possible final peel strength. This is not necessary, or indeed a desirable characteristic of copper foil if it is destined for the manufacture of multilayer boards, which now dominate the PCB market. In the case of MLB's inner layers, copper foil is encapsulated or "sandwiched" between the layers of "prepreg", and moreover, the double-sided laminates for inner layers are quite thin. That raises the need for "low-profile", "not too high peel strength" copper foil so that the laminate's dielectric properties are not adversely affected which frequently is a result of excessive bonding treatment.

On the other hand, the fact that the top-side (shiny side of the foil) is laminated against prepreg that separates it from the next inner layer raises the question of reliability of such adhesive joint. The shiny side of the foil is quite smooth and offers little "bondability." This is why manufacturers of MLB's apply to the top-side of copper tracks a so-called oxide treatment, to enhance their bondability.

It is widely accepted practice in the manufacturing of MLB's to use oxidation techniques to promote the adhesion between copper surface of the inner layers and the prepreg. Without oxide treatment the bond between copper and the prepreg layer is insufficient to withstand thermal shock of reflow soldering.

During the formative years of the multilayer board industry, with relatively less dense patterns of the inner layer circuitry the bond between the prepreg and the base laminate of the inner layers was not considered important. Copper tracks, it was believed, could be encapsulated in the cured prepreg. On the other hand, today's internal circuitry is very dense and most of the bonding is to copper rather than to base laminate. Thus, today the surfaces of copper tracks have to be "adhesion-prone."

The oxide treatment techniques used in the fabrication of MLB's are troublesome, expensive, and create their own technical problems. One, the so-called "pink ring" is a result in the chemical attack on copper oxide layers by the chemicals used in through-hole plating. It is customary now to engage in additional steps of brown-oxide treatment, which is a reduction of cupric oxide treatment to the metallic copper, since the bonding treatment composed of copper is immune to pink ring, as opposed to CuO which is easily dissolved in mineral acids. This reduction step further complicates brown oxide processes and renders them even more expensive.

It has been proposed that a special copper foil provided with the bonding treatment on the shiny side of the foil is better suited to fabrication of MLB's. If the bonding treatment is plated onto the drum side of the foil this results in a lower peel strength e.g., perhaps about 8 lbs./inch than when the same treatment is plated onto the matte side of the foil e.g., about 12 lbs./inch. Nevertheless, such peel strength is more than adequate in MLB's.

With respect to copper foil destined for use in producing MLB's, we have found that the brown oxide "treatment" which is presently applied to the shiny side of the foil and provides a quite low peel strength can advantageously be applied to the matte side of base foil, which by itself, due to its peaks and valleys topography and the resulting micro-roughness, has a considerable peel strength of about 4 lbs/inch, as opposed to the shiny side of the foil, which has substantially no peel strength at all. When this is done, very little brown oxide has to be applied to the matte side of the foil to bring the peel strength to the desired level of, e.g., 7 lbs/inch or so. This reduced amount of brown oxide is much less fragile in terms of structure, than the higher amount of brown oxide that has to be applied to the shiny side of the foil, to achieve the same peel strength. The need for reduction of cupric oxide to metallic copper can thus be eliminated, and the entire process becomes simpler and less expensive, while the quality of MLB's (particularly the dielectric properties and the resistance to delamination due to the solder shock) are improved.

However, the change in the process of manufacturing this special copper foil, when compared to the classical process, requires more than the mere application of bonding treatment to the shiny side, rather than to the matte side, of the base foil.

Since the matte side of this special foil will first be subjected to "imaging" when a circuitry pattern is transferred to a panel, and then to brown oxide treatment, the usual method of "stainproofing"0 the matte side to protect it from tarnishing and oxidation should be reformulated to render it more suitable for use in commercial operations.

What brown oxide treatment for MLB's and micro-etching techniques have in common is that either a sodium chlorite or a sulfuric acid peroxide micro-etching solution has to get to the surface of the copper to produce uniformly the desired reaction or effect. Stainproof layers, therefore, have to be either easily removed by precleaning solutions or be easily penetrable by brown oxide or micro-etch liquids. Excessively tenacious stainproof layers can form an impenetrable shield between a surface of copper and the processing chemicals, delaying the desired reactions or producing obvious non-uniformity.

With the advent of miniaturized electronics, very densely packed printed circuit boards are needed. Miniaturization often requires that the copper foil conductor, or track lines, of today's printed circuit board be as narrow as 5 mils or less. The degree of high definition of fine line circuitry depends on the quality of copper foil manufactured for the electronic industry, particularly on the surface quality of both sides of the foil.

It is the practice in manufacturing printed circuit boards from copper-clad laminate to form the image of the desired printed circuit pattern on the copper surface of the laminate by a photographic technique which leaves the desired pattern formed of a photoresist material on the surface of the copper. For the photographic imaging to be sharp and precise, photoresist has to spread well on the foil's surface and adhere well to this surface.

It is a practice in manufacturing printed circuit board to roughen the surface of the shiny side of the copper foil to achieve good resist adhesion. This roughening also removes tenacious stainproof films which foil manufacturers apply to the foil to protect it from oxidation and staining before it reaches the user. Photoresist does not adhere to the stainproof films, which therefore have to be removed. Thus, roughening of the foil surface serves the purpose of removal of stainproof film as well as changing the copper surface topography from smooth to micro-rough, to facilitate photoresist adhesion which is a condition of good definition of track lines.

This roughening is performed by either mechanical means, e.g., abrasion by brushes, scrubbing with pumice, or chemical means (so-called micro-etching), which is accomplished by subjecting the copper surface of copper-clad laminates to the etching action of oxidizing mineral acids. Such acids attack the smooth surface of the foil along the copper grain boundaries, thus creating pits and pores and changing the copper surface from smooth to micro-rough.

In the fabrication of MLB's copper foil is laminated (bonded) to polymeric substrates twice. First thin, double-sided copper-clad laminates are produced. These laminates are then subjected to image patterning and etching away of unwanted copper to produce the desired patterns of circuitry. Several layers of double-sided boards prepared in such a manner are stacked together, with sheets of prepreg inserted in between to separate dielectrically each inner board from the other. Such a stack of circuit boards and prepreg is then laminated together to form a monolithic multilayer board. Later, holes are punched or drilled through the board in prearranged places and so-called through-hole plating of copper is used to ensure the electrical interconnection between all layers of copper-track conductor lines.

Good bonding is required between the top surfaces of track lines (the surface which was used for image patterning) and the sheets of prepreg, in the course of second (so-called B-stage) lamination.

It is a practice in fabrication of MLB's to subject the inner layer boards, with their patterns of circuitry, to the so-called brown-oxide treatment, which changes micro-topography of the top surfaces of the track lines to improve their bondability to the polymeric prepreg. This brown oxide treatment is produced by immersing the boards in the alkaline solution of sodium chlorite which by its oxidizing action causes the conversation of metallic copper on the top surfaces of exposed copper tracks, into cupric oxide (CuO), possibly in admixture of cuprous oxide ($Cu_2O$), depending on the type of the bath and operating conditions. This oxide coating grows in the form of dendritic crystals, perpendicular to the surface of the copper tracks. Thus, the surface area available for bonding to polymeric substrates is increased and improved "bondability" is achieved.

Various patents directed to bonding treatments for copper foil disclose that one or both sides of the foil which is to be bonded to the substrate is subjected to the bonding treatment (U.S. Pat. No. 5,207,889), or that treatment for copper foil that is to be used for lamination to a board comprises electrodepositing a dendritic layer of copper followed by a gilding layer of copper on the side of the foil that is to be laminated to the board (U.S. Pat. No. 4,572,768). Also, the use of either the shiny or matte side of the foil to achieve flexibility in terms of surface characteristics of the resulting copper-clad laminates which have either a mirror-like finish shiny side or "copper clad laminate having a satin finish"(matte side) is disclosed in U.S. Pat. No. 3,998,601. U.S. Pat. No. 3,857,681 discloses the application of copper dendritic and gilding layers to at least one of the surfaces of copper foil to improve the bond strength when laminated to a polymeric substrate, followed by the application of a zinc coating to prevent laminate staining or discoloration.

It is also known to apply a stainproofing chromate layer on the surface of copper foil to protect against tarnish and oxidation, as disclosed in U.S. Pat. Nos. 3,625,844 and 3,853,716.

The matte side of the foil, with its own micro-roughness and the resulting bondability is a better surface upon which to grow the layer of brown oxide, than the traditionally used shiny side of the foil, even if it is roughened by either micro-etching or mechanical abrasion.

SUMMARY OF THE INVENTION

It is the general object of the present invention to provide a method of controlling the surface characteristics of the matte surface of copper foil to make it particularly suitable for high resolution image patterning, and also a method of providing the matte surface with a stainproofing layer which in the course of fabrication of printed circuit boards can be easily removed by dissolution in aqueous solutions of alkalies. Other objects and advantages of the present invention will become apparent from the following description thereof and from the practice of the invention.

To achieve the objects of the present invention there is provided copper foil suitable for use in the manufacture of printed circuit boards, which foil comprises an electrodeposited copper base foil having a matte surface and an opposing shiny surface, an oxidation-and-tarnish-resistant protective layer on the matte surface, which comprises metallic zinc and one or more compounds of tri-valent chromium and is soluble in an alkaline solution, and an electrodeposited copper-containing bonding treatment on the shiny surface.

Preferably, the weight ratio of the zinc (calculated as metallic zinc) to the chromium (calculated as metallic chromium) in the protective layer on the matte surface is at least 1:1, and more preferably about 2:1.

Another aspect of the present invention is a method for protecting the surface of copper foil against tarnishing and oxidation which comprises forming an electrolyte comprising an acidic aqueous solution containing hexavalent chromium ion-containing anions and zinc; immersing the copper foil in said electrolyte; and rendering the copper foil cathodic while immersed in the electrolyte to form thereon a protective layer containing zinc and one or more chromates as components thereof and having a zinc to chromium ratio of at least 1:1. The electrolyte preferably has a pH of from about 3 to 4.5.

In accordance with the present invention, the matte side of the foil is provided with a stainproofing layer (derived from the stainproofing electrolyte and applied electrolytically to the foil's surface) which, while protecting the foil from oxidation prior to the foil's use, can be easily removed from the surface of copper-clad laminate by simple immersion in a dilute alkaline solution such as aqueous sodium or potassium hydroxide at a low temperature, e.g., perhaps about 8 lbs./inch e.g. approximately ambient, without the need of brushing, scrubbing or micro-etching.

The purpose of the stainproofing process in the manufacture of copper foil is to form a surface of the foil a protective coating which extends the shelf-life of the foil by protecting it against atmosphere oxidation as well as from oxidation at elevated temperatures used during the laminating processes by which copper-clad laminates are fabricated.

The stainproofing layer which protects the copper foil against oxidation has more functions than just extending shelf-life of the foil. Once the copper-clad laminates are ready for further processing, the protective layer has to be easily removed from the image patterning side of the foil by quick and complete dissolution in alkalies, since the complete removal of stainproofing compounds is required to assure good adhesion of photoresists, unhindered response to the etchants and good acceptability of brown oxide treatment. Thus, the type, structure, chemical composition and the thickness of the stainproofing layer that protects the "processing" side (the side subjected to imaging) of the foil is extremely important.

The present invention takes advantage of the fact that copper foil produced by means of electrodeposition on rotating drum cathode possesses two top surfaces which are not the same. While the surface next to the drum, the shiny side of the foil, even when viewed under great magnification is relatively flat and smooth, the surface next to the electrolyte, the matte side of the foil, is already micro-rough (viewed under high resolution electro-microscope the surface is composed of micro-peaks and micro-valleys). Moreover the degree of micro-roughness can be controlled by the manufacturer of copper foil much better than when mechanical or chemical roughening is performed by manufacturer of printed circuit boards.

Thus, a laminate produced by bonding foil matte side up to the polymeric material assures excellent photoresist adhesion and thus high degree of fine-line precision of definition. The bonding treatment applied to the shiny side (or drum side) of the foil, assures good anchoring of track lines to the polymeric substrates.

There is a further advantage of the present invention that results from fabrication of the copper foil with the bonding treatment applied to the shiny side of the foil and using the matte side for the image patterning. This advantage is that such foil is particularly well adapted for use in the manufacture of MLB's which now dominate the printed circuit board market because they permit achieving the highest functional density of circuitry in electronic packaging.

BRIEF DESCRIPTION OF THE DRAWINGS

The following description of the present invention will be better understood by reference to the accompanying drawings, which form a part hereof. In the drawings.

DESCRIPTION OF THE INVENTION AND A PREFERRED EMBODIMENT THEREOF

Figure 1:
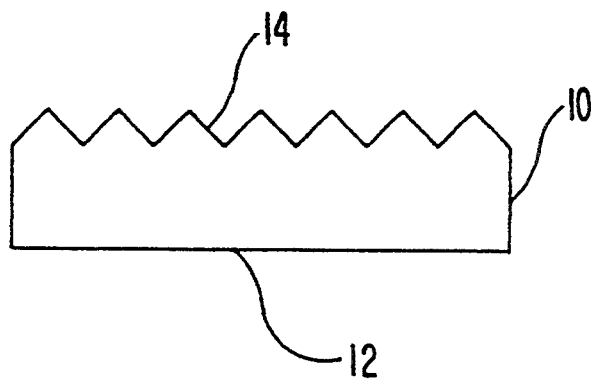
FIG. 1 illustrates conventional copper base foil.
Figure 2:
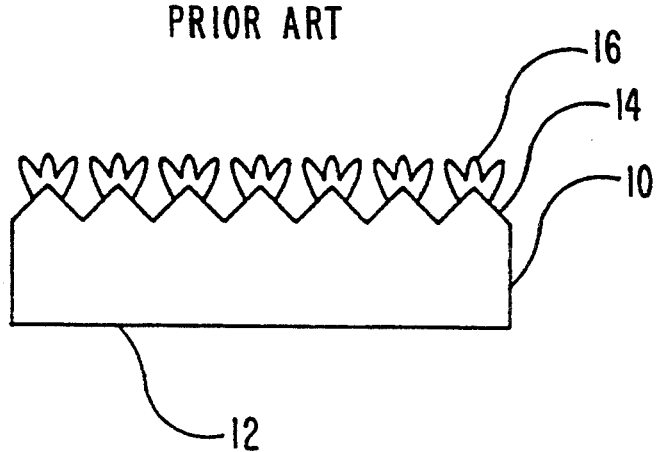
FIG. 2 illustrates conventional finished copper foil having a bonding treatment applied to the matte side thereof.
Figure 3:
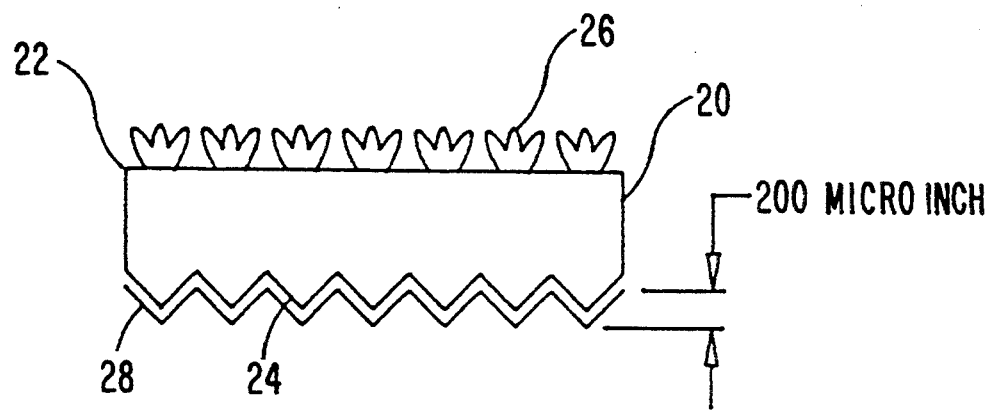
FIG. 3 illustrates copper foil in accordance with the present invention.

Referring to FIG. 3, finished copper foil in accordance with the present invention comprises an electrodeposited copper base foil 20 having a matte surface 24 on which there is electrodeposited a protective layer 28 containing zinc and one or more compounds of trivalent chromium, referred to hereinafter as a chromate or chromates. The foil 20 has a smooth, or shiny side, 22 on which there is an electrodeposited bonding treatment 26. The matte surface of the raw foil preferably has a surface roughness, or $R_z$, (as hereinafter defined) of from about 3 to about 8, most preferably about 5, microns.

The base foil may be formed by any of the well-known techniques for producing copper foil, such as the one wherein a thin foil is electrodeposited from a copper ion-containing electrolyte onto the smooth surface of a rotating drum cathode partially immersed in the electrolyte and then stripped from the surface of the drum, slit and rolled. The copper foil so-produced has one surface, on the drum side, which is smooth or shiny and a matte surface, on the opposing electrolyte side.

In the fabrication of copper-clad laminates for printed circuits, copper foil is bonded to a polymeric substrate (a composite material such as epoxy, polyimide or a like resin reinforced with glass fiber fabrics) by means of mechanical interlocking at the interface between the two materials.

To achieve a high degree of interlocking, the bonding side of the foil is provided with a bonding treatment. Such treatment is an extremely dense coating of copper spherical microprojections, which is electrodeposited to the shiny or smooth (drum) side of the base copper foil.

The peel strength of copper foil (force necessary to separate, or pull away, the foil from the polymer substrate) will depend on the shape of individual microprojections, their mechanical strength and hardness, density per surface area, and their distribution over the smooth surface of the drum side of the base foil. In turn, all the factors listed above will depend on the conditions under which the bonding treatment is electrodeposited.

The preferred bonding treatment is effected by subjecting the shiny side of the base or "raw" foil to four consecutive electrodeposition steps. The first consists of the deposition of a microdendritic copper layer which enhances, to a very large degree, the real surface area of the matte side, and thus enhances the foil's bonding ability. It is followed by electrodeposition of an encapsulating, or gilding, layer the function of which is to mechanically reinforce the dendritic layer, and thus render it immune to the lateral shear forces of liquid resins in the laminating stage of the PCB's fabrication. Then, a so-called barrier layer is deposited on the dual-layer copper treatment, after which a stainproofing layer is applied.

The purpose of the dendritic deposit is to increase the "true" surface area of the shiny side since that property is ultimately responsible for the bonding characteristics of the foil. The shape, height, mechanical strength and the number of dendritic microprojections per surface area which constitute dendritic deposit are the factors instrumental in achieving adequate bond strength of the foil, after all stages of the treatment are completed. The dendritic deposit, the first stage of the treatment, is relatively weak mechanically and given to unacceptable treatment transfer characteristics.

The encapsulating step of the treatment is very important, since it eliminates the foil's tendency toward "treatment transfer" and the resulting "laminate staining" which can cause the decrease of the laminate's dielectric properties. The role of this second treatment stage, is to mechanically reinforce the fragile dendritic layer, by overplating it with a thin layer of sound and strong metallic copper, which locks the dendrites to the base foil. Such a dendrites-encapsulation composite structure is characterized by high bond strength and the absence of treatment transfer. The treating parameters which assure just that are relatively narrow. If the amount of the gilding deposit is too low, the foil will be given to treatment transfer. If, on the other hand, the gilding layer is too thick, a partial loss of peel strength may be expected. These first two layers of the treatment are composed of pure copper, in the form of microscopic, spherical micro-projections.

The dual-layer copper bonding treatment may have electrodeposited thereon a very thin layer of zinc or zinc alloy, a so-called barrier layer. During the fabrication of copper clad laminates destined for PCB's, the zinc-containing layer alloys with the underlying all-copper bonding treatment by the process of heat-accelerated diffusion of metals in the solid state. As a result, a layer of chemically stable alpha brass is thus formed over the surface of the all-copper treatment. Its purpose is to prevent direct copper-epoxy resin contact, and this is why the zinc-containing layer (which during lamination is converted to alpha brass), is referred to as a barrier layer. If the bonding treatment composed of copper only is subjected to lamination with epoxy resin systems, it tends to react with amino groups of the resin, at the high laminating temperatures. This, in turn, may create moisture at the foil-resin interface, causing the harmful effect of "measling", and possibly delamination. The barrier layer plated over the all-copper bonding treatment prevents these harmful effects.

All three stages of the treatment mentioned above, as is well-known in the art, are effected by means of electrodeposition, change the geometry and morphology of the smooth side of the foil and assure the mechanical strength of the surface region.

The foil treated as described above may then be subjected to an electrochemical stainproofing which changes the surface chemistry. As a result of this step, the bonding surface is rendered chemically stable. This stainproofing operation removes weak surface films, which can greatly decrease the adhesion of the foil to the substrate, and provides a stable film of controlled thickness, responsible for imparting on the treated surface "durability" of its properties.

The above bonding treatment, barrier layer and stainproofing may be applied to the shiny surface of the base foil by the methods disclosed in U.S. Pat. No. 4,572,768 to Wolski et al., U.S. Pat. No. 5,207,889 to Wolski et al., U.S. Pat. Re 30,180 and/or U.S. Pat. No. 3,857,681 to Yates et al., all of which are incorporated herein by reference.

In accordance with the present invention, the shiny side of the foil destined for fabrication of the inner layers of multilayer PCB's is provided with the bonding treatment which offers high peel strength interlocking with a polymeric substrate in the production of thin laminates (primary lamination).

The opposite foil surface—the matte side of the foil—represents an outside surface of these laminates, and as such, is processed or subjected to "imaging" when a circuitry pattern is transferred to a panel by one of the well-known photochemical processes and subsequent etching away of unwanted copper later. The matte (outer) surfaces of circuit lines are typically subjected to brown oxide treatment to provide improved bondability to the "prepreg" in the course of a second lamination process.

If the matte side of the foil is endowed with appropriate surface characteristics, it can fulfill the roles described above much better than the shiny (smooth) side of the foil.

In the case of traditional laminates, when the shiny side of the copper foil represents an outside surface of a copper-clad laminate, the fabrication of PCB's begins with removal of the stainproof layer from the foil's surface. This is accomplished by either chemical (alkaline soaking followed by acid soaking) cleaning, or mechanical cleaning, which removes stainproof layer by abrasion (wire-brushing, pumice scrubbing, or the like). After that, the smooth surface of the shiny side of the foil has to be roughened either mechanically or chemically (micro-etching) to create a surface topography which ensures good spread and adhesion of photoresist, this adhesion being very important to a sharp definition of copper track lines.

The photoresist adheres better to a roughened copper surface, and thus provides better line definition, than when applied to an unprepared, flat surface of the shiny side of the foil. The above roughening techniques, both mechanical and chemical, are complicated and expensive. Moreover, mechanical roughening (scrubbing or brushing) negatively affects the dimensional stability (warping) of the thin laminates, lowering quality standards of precision artwork, registration, etc.

The present invention obviates the need for the above operations when laminates for MLB's are prepared matte side up, since the stainproofing of the present invention may be removed by a brief immersion in diluted alkaline solution of, e.g., sodium or potassium hydroxide, thus preparing the surface for application of the photoresist. Roughening of the surface is not necessary, since the matte side is characterized by its own micro-roughness, which assures excellent adhesion of photoresist and thus, also, good definition of fine-line circuitry. Moreover, the subsequent application of the brown oxide treatment is facilitated, since the matte surface, with its peaks and valleys topography, is much better in anchoring firmly the crystals of cupric oxide grown on its surface, compared to the shiny and smooth surface of traditional foil. The quality of the brown oxide treatment is thus improved since less oxide treatment grown on the matte side is required to secure the desired peel strength.

The matte side of the foil, which has a velvety finish as a result of a difference in the growth rate of differing crystal faces during electrodeposition of the copper forming the base or "raw" foil, is characterized by its specific micro-topography. Viewed under high magnification of an electron microscope it is composed of peaks and valleys. The peaks are closely packed cones or pyramids having a typical height of about 5 microns. The cones' height, slant, packing and shape depend upon closely controlled parameters of the electrodeposition process, as is well-known. In turn, the surface quality of the matte surface of the base foil determines its suitability for the application as a top surface of thin laminates for inner layers in the MLB's fabrication. The criteria of suitability depends upon the quantitative evaluation of the matte side's surface roughness. A variation which gives useful information about the surface is called Rz, which is the average deviation from the mean line of the five highest peaks and the five lowest valleys within the roughness sampling length. The foil of the present invention preferably, has an Rz of from about 3 to about 8 microns, and the Rz of the 1 ounce foil is typicaly about 5 microns (or 200 micro inches).

The process of electrodeposition of the base foil on the rotating drum is responsible for the surface characteristics of the matte surface of the foil. A discussion of relationships that link these characteristics with plating parameters of the process may be found in U.S. Pat. No. 5,215,646 to Wolski, et al., (Except that in the case of present invention only the first electrodeposition zone is used), which patent is incorporated herein by reference.

The stainproofing layer on the matte side of the foil, i.e., the processing side, is necessary when foil is stored and later on laminated to polymeric substrates. However, this protective layer is a hindrance in fabricating printed circuit boards, since it forms an impenetrable shield between the surface of the foil and the processing chemicals. As an example, photoresists do not adhere well to the stainproof layer, and satisfactory photoimaging cannot be accomplished, without first removing the stainproofing layer and exposing the surface of pure metallic copper underneath.

The proper chemical composition and the thickness of the stainproof layer are very important in achieving a good, easily removable stainproof layer, while not diminishing its protective ability.

Providing the matte side of the foil with the layer of stainproofing in accordance with the present invention involves the simultaneous deposition of chromate ions and metallic zinc, and this is a very unusual case of alloy plating, since one constituent of the electrolyte, chromic acid, is reduced at the foil surface (cathode), not to a metallic state, but to a trivalent state, which in turn enables the formation of a chromate stainproofing layer on the matte surface 24.

The stainproofing electrolyte used in the present invention has the dual function of chromating and zincating, and thus forms the protective layer of the stainproofing of the present invention, which is also dual in its protective role, offering both mechanical protection, typical of conversion coatings, as well as electrochemical (sacrificial) protection, typical of zinc coatings.

The factor which makes possible the co-deposition of chromates and metallic zinc is the pH of the electrolyte. At very low pH values, e.g., a pH of 2, (which is the value for 3 G/L CRO$_3$) hexavalent chromium compounds are very strong oxidants, thus counteracting the cathodic reduction of zinc. At such a pH the standard electrode potential Eo has a value of +1.33 V for the following reaction:

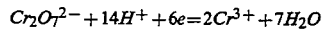
$$Cr_2O_7^{2-} + 14H^+ + 6e = 2Cr^{3+} + 7H_2O$$

under such conditions co-deposition of zinc is impossible. In basic solutions, chromates rather than dichromates are the prevailing species, and are by and large much less oxidizing.

The reaction:

$$CrO_4^{2-} + 4H_2O + 3e = Cr(OH)_3 + 5OH^- \quad Eo = 0.13V$$

is much closer to the standard electrode potential of zinc Eo = −0.76 and enables the deposition of the chromates and metallic zinc.

In accordance with the present invention the bulk of the electrolyte is moderately acidic, and preferably has a pH value of from about 3 to about 4.5, most preferably from about 3.5 to about 4, and typically the electrolyte has a pH of about 4 which is, of course, far from basic, but it refers to the bulk of the electrolyte. The pH at the foil—solution interface, however, exceeds 7. Whenever there is a flow of current there is necessarily a reduction of some chemical species at the cathode (foil). In the present process cathodic reactions are:

Reduction of $Cr^{6+}$ (written above)
Reduction of zinc $Zn^{2+} + 2e = Zn$
Reduction of water $2H_2O + 2e = 2 OH^- + H_2$ It is the last reaction, i.e., evolution of hydrogen at the foil surface which is responsible for the above-mentioned local increase of pH, and thus allows for simultaneous precipitation of chromate layer and the deposition of zinc.

It has been found, by studying the chemical composition of experimental stainproof layers, using instrumental methods of surface analysis (scanning auger microprobe, and ESCA (electron spectroscopy for chemical analysis), that stainproofing layers capable of good protection action while also being easily removable by immersion in alkalies, typically contain about 10–20% of chromium (calculated as metallic chromium) and 20–40% of zinc (calculated as metallic zinc) (the balance is water) and are less than 100 angstroms thick. The ratio of chromium to zinc is very important. The relatively high zinc content in the layer assures that the layer is easily dissolved by alkalies, due to the amphoteric character of this metal it dissolves in sodium hydroxide forming sodium zincate with copious evolution of hydrogen. Therefore, the stainproofing layer should have a zinc to chromium ratio (both calculated as the metal) of at least 1:1, and preferably about 2:1, by weight.

Since the atoms of zinc are uniformly dispersed within the lattice of the chromates such as the chromium hydroxide component of the protective layer, alkaline cleaners attack and dissolve atoms of zinc, hydrogen is formed, and this combined effect of alkaline attack and "fizzing" lifts chromium compounds off the surface of the foil leaving it, after the rinse, pure and clean, and ready for further PCB processing.

The following electrolyte and electroplating conditions may be used to form the stainproofing layers described above:

Electrolyte
CrO$_3$—0.75 grams/liter (g/l)–2 g/l; preferably 1.25 g/l
Zn (calculated as Zn) —0.3 g/l—1.0 g/l; preferably 0.5 g/l
H$_3$PO$_4$ 0 g/l–2 g/l; preferably 0.5 g/l
H$_2$O—balance
Electroplating Conditions
pH—3.5—4.0
T—90° F.
Current density—0.5 (amperes per square ft.) A/ft$^2$—20 A/ft$^2$; preferred 10A/ft2
Plating time—1 second to 5 seconds; preferred 3 seconds The copper foil is rendered cathodic with respect to the anode, immersed in the bath, and facing the foil, and thus electrodeposition of the stainproofing layer is accomplished. The present stainproofing method is an improvement in the prior stainproofing methods disclosed in U.S. Pat. No. 3,625,844 to McKean and U.S. Pat. No. 3,853,716 to Yates et al. both of which are incorporated herein by reference.

If desired, the same stainproofing may also be applied to the shiny side of the foil having the above-described bonding treatment.

The bonding treatment plated onto the drum, or shiny side of the foil results in lower peel strength than the same bonding treatment plated onto the matte side of the foil, (perhaps 8 lbs/ inch rather than 12 lbs/inch), nevertheless such lower peel strength is more than adequate in MLB's.

On the other hand, when the brown oxide treatment, presently applied to the shiny side of the foil and supplying quite low peel strength, is applied to the matte side of base foil relatively very little brown oxide has to be applied to the mat surface of the foil to bring the peel strength to the desired level about 6 lbs./inch or so. This is because the matte side of the base foil by itself, due to its peaks and valleys topography and the resulting micro-roughness has a considerable peel strength of about 4 lbs./inch, as opposed to the untreated shiny surface of the foil, which has substantially no peel strength at all. This reduced amount of brown oxide is much less fragile in terms of structure, than the large amount of brown oxide that is presently applied to the shiny surface of the foil to achieve the same peel strength. When the matte surface of the foil is subjected to the brown oxide treatment, the need for reduction of cupric oxide to metallic copper is eliminated, and the entire process becomes simpler and less expensive, while the quality of MLB's (particularly the dielectric properties and the resistance to delamination due to the solder shock) are improved.

When the shiny surface of the copper foil is used as the processing side of the foil, cleaning and roughening of the surface prior to resist (both etch resist and plating resist) application is critical. Since there is less surface area for the resist to cling to, that surface must be at an optimum state in order for the resist to adhere and provide a successful etch. An area where the resist lifts at the edge of a circuit trace or where there is a deep gouge that the resist does not fully cover could mean an etched-through trace which may require expensive repair or scrapping the board altogether. Such cleaning and roughening of the process side of the copper foil is accomplished by the use of the well-known mechanical scrubbing and micro-etching techniques, the need for which is obviated by copper foil in accordance with the present invention.

The following Example describes a preferred embodiment of the present invention and demonstrates certain advantages thereof.

EXAMPLE

A web of "base" (or "raw") foil, 35 microns thick (so-called one ounce foil in terms of weight per surface area) was produced by means of electrodeposition of copper on a rotating drum-cathode, using the electrolyte, grain refining agents and plating parameters described in column 17 of U.S. Pat. No. 5,215,646 to Wolski, et al. which is incorporated herein by reference, except that only primary anodes were used, and the secondary anode was not used.

This "base" foil had one top surface which was smooth or shiny, and another opposite top surface which was "matte" because of its complex micro-topography. The second surface was composed of micro-peaks and micro-valleys, which together formed the matte side's micro-roughness. The matte side of the foil was examined for micro-roughness (by a stylus-type instrument) which was found to be 210 micro inches.

The base foil described above was, in turn, passed through a "treater" machine in order to provide the shiny side of the foil with a plural-layer (copper dendritic layer, copper gilding layer and a barrier layer) bonding treatment, and to provide the matte side of the foil with an easily removable stainproofing layer.

This multi-layer bonding treatment applied to the shiny side of the foil employed the techniques, plating parameters, and the electrolytes described in U.S. Pat. No. 4,572,768 to Wolski et al., which is incorporated herein by reference, to produce a treated side.

The matte side of the foil was provided with an easily removable (by means of dissolution in 5% solution of sodium or potassium hydroxide) stainproofing film. The technique of electrolytic copper stainproofing process used was based on U.S. Pat. No. 3,853,716 to Yates et al., which is incorporated herein by reference, using an electrolyte comprising:

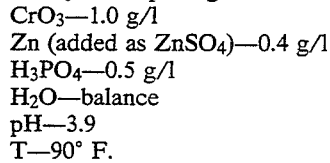

$CrO_3$—1.0 g/l
Zn (added as $ZnSO_4$)—0.4 g/l
$H_3PO_4$—0.5 g/l
$H_2O$—balance
pH—3.9
T—90° F.

The stainproofing layer was deposited electrolytically on the matte side of the foil (which was used as a cathode), employing a current density of 2A/ft$^2$ and a plating time of 1.5 seconds. The resulting stainproofing layer was examined and found to comprise metallic zinc and chromates and to have a zinc to chromium ratio of 1.85:1.0.

The copper foil produced in the manner described above was then subjected to the following tests:

The copper foil was laminated (bonded) to a prepreg (composite material of glass fiber fabric and epoxy resin) designated FR-4 by the National Electrical Manufacturer's Association (NEMA) in two variants:
 1. treated side down
 2. matte side down The peel-strength of each of the treated sides and the matte side to the prepreg was then measured. The peel-strength of the shiny side of the foil with the bonding treatment was found to be 9.8 pounds per inch of width of laminate, while the peel-strength of the matte side of the foil was found to be 4.2 lbs/inch.

Another "matte side-up" laminate was prepared as described above and the "cleanability" of the matte surface was examined. The laminate was first immersed for 30 seconds in 5% solution of sodium hydroxide, at room temperature and then thoroughly rinsed. The laminate was then immersed in a commercial brown oxide a solution, a solution manufactured by Mac Dermid Company, 9804/9805 bronze oxide. The pink colored matte side of the copper immediately acquired a deep brown color, due to the copper's reaction with sodium chlorite which is the main constituent of the brown oxide solution. This indicates that this stainproofing film was completely removed by immersion in the solution of sodium hydroxide and that the stainproofing layer was easily removable. If the stainproofing layer had not been removed, the pink colored matte side would not have reacted with the brown oxide solution, and the deep brown color of cupric oxide would not have appeared on the copper surface.

Having described the present invention and a preferred embodiment thereof, variations and modifications thereof falling within the spirit of the invention may become apparent to those skilled in the art, and it is to be understood that the scope of the invention is to be determined by the appended claims and their equivalents.

What is claimed is:

1. Copper foil useful for the manufacture of printed circuit boards, which foil comprises:
   a. an electrodeposited copper base foil having a matte surface and an opposing shiny surface,
   b. an oxidation-and-tarnish resistant protective layer on said matte surface, which comprises metallic zinc and one or more compounds of tri-valent chromium and has a zinc to chromium weight ratio of at least about 1:1 and which is soluble in a dilute alkaline solution, and
   c. an electrodeposited plural-layer bonding treatment on said shiny surface.

2. The copper foil of claim 1, wherein said alkaline solution is a dilute aqueous alkaline solution at substantially ambient temperature.

3. The copper foil of claim 1, wherein the weight ratio of zinc to chromium in said protective layer is at least about 2:1.

4. The copper foil of claim 1, wherein said protective layer comprises from about 20 to about 40 wt. % zinc and from about 10 to about 20 wt. % chromium.

5. The copper foil of claim 1, wherein said bonding treatment comprises an electrodeposited dendritic copper layer on said shiny surface and an electrodeposited gilding copper layer on said dendritic copper layer.

6. The copper foil of claim 5, wherein said protective layer is electrodeposited, said zinc is metallic zinc, and the weight ratio of zinc to chromium therein is at least about 2:1.

7. Electrolytic copper foil having a matte surface and a shiny surface and the matte surface thereof being covered by an anti-corrosive, heat resistant layer, said layer comprising metallic zinc and the salts of tri-valent chromium and being soluble in a dilute aqueous alkaline solution.

8. The copper foil of claims 7, wherein the zinc to chromium weight ratio in said layer is greater than 1:1.

9. The copper foil of claim 7, wherein said layer contains from about 20 to about 40 wt. % zinc and from about 10 to about 20 wt. % chromium.

* * * * *